United States Patent
Wang et al.

(10) Patent No.: US 9,910,673 B2
(45) Date of Patent: Mar. 6, 2018

(54) RECONFIGURABLE MICROPROCESSOR HARDWARE ARCHITECTURE

(71) Applicants: Xiaolin Wang, Methuen, MA (US); Qian Wu, Redwood City, CA (US)

(72) Inventors: Xiaolin Wang, Methuen, MA (US); Qian Wu, Redwood City, CA (US)

(*) Notice: Subject to any disclaimer, the term of this patent is extended or adjusted under 35 U.S.C. 154(b) by 0 days.

(21) Appl. No.: 15/488,672

(22) Filed: Apr. 17, 2017

(65) Prior Publication Data
US 2017/0300333 A1 Oct. 19, 2017

Related U.S. Application Data

(60) Provisional application No. 62/324,616, filed on Apr. 19, 2016.

(51) Int. Cl.
| | |
|---|---|
| *G06F 9/30* | (2006.01) |
| *G06F 9/455* | (2018.01) |
| *G06F 17/50* | (2006.01) |
| *G06F 15/78* | (2006.01) |
| *H04B 1/00* | (2006.01) |
| *G06F 15/76* | (2006.01) |

(52) U.S. Cl.
CPC .......... *G06F 9/30181* (2013.01); *G06F 9/455* (2013.01); *G06F 15/76* (2013.01); *G06F 15/7867* (2013.01); *G06F 17/5054* (2013.01); *H04B 1/0003* (2013.01); *G06F 2015/768* (2013.01)

(58) Field of Classification Search
CPC .. G06F 9/30181; G06F 9/455; G06F 15/7867; G06F 17/5054
See application file for complete search history.

(56) References Cited

U.S. PATENT DOCUMENTS

| | | | |
|---|---|---|---|
| 8,819,686 B2* | 8/2014 | Memik | G06F 1/206 718/102 |
| 2005/0278680 A1* | 12/2005 | Mukherjee | G06F 17/5054 716/105 |
| 2008/0005539 A1* | 1/2008 | Velhal | G06F 11/008 712/220 |
| 2009/0228684 A1* | 9/2009 | Ramesh | G06F 15/16 712/29 |

* cited by examiner

*Primary Examiner* — Jason M Crawford
(74) *Attorney, Agent, or Firm* — Maine Cernota & Rardin

(57) ABSTRACT

A reconfigurable, multi-core processor includes a plurality of memory blocks and programmable elements, including units for processing, memory interface, and on-chip cognitive data routing, all interconnected by a self-routing cognitive on-chip network. In embodiments, the processing units perform intrinsic operations in any order, and the self-routing network forms interconnections that allow the sequence of operations to be varied and both synchronous and asynchronous data to be transmitted as needed. A method for programming the processor includes partitioning an application into modules, determining whether the modules execute in series, program-driven parallel, or data-driven parallel, determining the data flow required between the modules, assigning hardware resources as needed, and automatically generating machine code for each module. In embodiments, a Time Field is added to the instruction format for all programming units that specifies the number of clock cycles for which only one instruction fetch and decode will be performed.

7 Claims, 17 Drawing Sheets

Multi-core Processor Architecture

Data Write Unit

Data Read Unit

Architecture of a Cognitive Data Routing Network Unit

Partitioning Application Software into Modules

Example of a Data Dependency Graph

| Opcode | Opcode |
|---|---|

Prior Art CPU Instruction

Figure 13A
(Prior Art)

| Opcode | Opcode | Opcode |
|---|---|---|

Present Invention

Figure 13B

RECONFIGURABLE MICROPROCESSOR HARDWARE ARCHITECTURE

RELATED APPLICATIONS

This application claims the benefit of U.S. Provisional Application No. 62/324,616, filed Apr. 19, 2016, which is herein incorporated by reference in their entirety for all purposes.

FIELD OF THE INVENTION

The invention relates to microprocessor designs and programming methods, and more particularly, to parallel multi-core processor designs and programming methods for efficient data processing by a parallel multi-core processor.

BACKGROUND OF THE INVENTION

As the need for increased real-time processing power has increased and it has become more and more difficult to increase processor clock rates, there has been a growing demand for a programmable and reconfigurable microprocessor architecture and corresponding programming method that are highly efficient and readily adaptable to a variety of software applications.

Often, three technologies are used in combination to provide adaptable, high efficiency processing solutions, namely application specific integrated circuits (ASIC), general purpose microprocessors (GPM), and field-programmable gate arrays (FPGA). ASIC's are typically designed for specific applications, and typically offer only very limited programmability. GPM's and FPGA's can both be adapted to different applications using programming languages at varying levels.

In particular, GPM's can typically be programmed using high-level software programming languages, whereby a user writes the code using a high-level language, after which a compiler is ultimately responsible for generating the machine code that runs on the GPM. This approach can be highly adaptable, and can reduce software development time, such that a GPM-based solution is typically the best approach for minimizing software development costs if it can meet the requirements of the application. However, the resulting solutions typically have lower hardware efficiency than an ASIC, causing GPM-based solutions to generally be more expensive and more power hungry than ASIC-based solutions.

FPGA's can only be programmed using more primitive "register transfer language (RTL) such as VHDL or Verilog, which requires more software development time. Also FPGA's represent a trade-off wherein the hardware overhead is high in exchange for being adaptable to different applications. Accordingly, the power consumption and cost of a product based on an FPGA is usually much higher than a similar product that uses an ASIC. In general, therefore, there is always a tradeoff between cost, power, and adaptability.

For the last several decades, as per the so-called "Moore's Law," GPM processor clock frequencies have doubled approximately every eighteen months or so. Hence, if a compiled program did not meet a certain requirement (i.e. cycle count exceeds what is required) using current technology, it was only necessary to wait a few years until the processor clock frequency increased to meet the requirement. However, this trend of increasing clock frequencies has come to a virtual stop, due to power and light-speed limitations, such that application requirements that cannot be met using current GPM processors cannot be addressed simply by waiting.

Over the years, engineers have tried to improve the hardware efficiency of GPM's using so-called "pipelined" processors that take advantage of application programs that have multiple, independent threads of equal lengths.

These include "same instruction multiple data" (SIMD) processors for threads that follow the exact same instruction sequence, as well as "very long instruction word" (VLIW) processors for threads that follow different instruction sequences. However, if an application program has multiple threads with very different lengths or multiple threads with data communication between them, then SIMD and VLIW architectures do not offer much advantage as compared to non-pipelined GPM's.

Other approaches include using special purpose processors that optimize specific operations in an application, such as digital signal processors (DSP's), image processors, network processors, and graphics processors. For example, a DSP typically includes a multiply accumulator (MAC) that has a throughput of one cycle. This can be very useful for signal processing applications, because multiply accumulate operations are very common in digital signal processing. However, if a DSP is used for network processing, it will be highly inefficient, since network processing does not typically require multiply operations. Instead, a network processor typically does not include a special multiplier, but does include features that optimize the table lookup operation, since table lookup is the most common operation used in network processing. In the same way, a network processor would be highly inefficient if used for digital signal processing.

Another problem with current pipelined processors arises from limitations that are inherent in the design of the pipeline stages. A modern pipelined processor, operating at a very high-clock rate, will typically include more than ten pipeline stages. This means more than ten cycles are required to perform a branch, even though only a couple of pipeline stages are actually being utilized. For example, algorithms with continuous branching do not use most of the pipeline stages, leading to very low efficiency. Instead, a processor with very few pipeline stages (i.e. very simple hardware) has to be used for such algorithms to improve the efficiency.

Due to these limitations to the current technology, modern-day handset "system on chip" (SoC) designs, for example, are forced to incorporate many of the technologies described above in combination to deliver a handset application. For example, a typical handset SoC might include a few "advanced RISC machine" (ARM) cores (big and small), an image processor, a graphics processor, a DSP, etc.

What is needed, therefore, is a parallel processor architecture and corresponding programming method that will provide very fast data processing with high energy efficiency, while also being highly programmable for use in multi-purpose devices and adaptable as new requirements and new applications arise.

SUMMARY OF THE INVENTION

In a first general aspect of present invention, a reconfigurable and programmable multi-core processor is disclosed that includes a plurality of programmable elements and memory blocks and a self-routing cognitive on-chip network.

The self-routing cognitive on-chip network can transfer data or parameters between different ports of the processor, where each port consisting of a data channel and a bi-directional protocol channel, and the on-chip network operates to connect two ports together by connecting the data channels together from output to input, and by connecting the bi-directional protocol channels to each other.

The programmable elements include:
processing units capable of intrinsic operations that are commonly used by applications;
memory read and write interface units; and
on-chip cognitive data routing units that can be configured or programmed to route data via the on-chip network from any processing unit to any memory block, from any processing unit to any other processing unit, from any memory block to any processing unit, or from any memory block to any other memory block. In embodiments, the data routing units can route multi-bit conditions along with data.

In embodiments, the cognitive data routing network units and the cognitive on-chip network can be used to form data and parameter passing channels for target application software with or without the assistance of the memory blocks.

In certain embodiments, the various processing units are capable of intrinsic operations such as multiplication, addition, subtraction, left shift, right shift, and normalization. In some of these embodiments, at least some of these processing units can perform any combination of some or all of these operations in any order. By using the self-routing cognitive network to connect the operations, the sequence of operation can be varied to fit the requirements of the application software, and thereby to reduce the overall operation delay.

In embodiments, the self-routing network routes connections to an input port or an output port by setting a control register. In other embodiments, the network routes data from an input to an output by setting a forwarding tag associated with the data. In still other embodiment the self-routing network is first configured by establishing a path between a specific input and a specific output via setting of control registers, after which either the sender of data and/or or receiver of data can add forwarding tags that match the control register bits to specify usage of the path.

In various embodiments, the cognitive on-chip network can establish a connection between two ports that allows both synchronous transmission and asynchronous transmission of data and parameters, depending on the needs of the application software.

In various embodiments, the bi-directional protocol channels of the cognitive on-chip network can be defined to represent any user defined protocol, so as to ensure that the proper batch of data is being processed at any given time.

In various embodiments, the data and protocol channels in the cognitive on-chip network can be configured for asynchronous transmission of data, such as circular buffer, FIFO, stack, mail box, semaphore, or event triggered transmission, etc. In some of these embodiments, the forward protocol channel bits can be defined as valid, ready, next batch, end of transmission, write enable, etc., while the backward protocol channel bits can be defined as hold, full, read enable, etc.

In certain embodiments, at least one of the processing units is capable of generating outgoing protocol channel bits based on receipt of input protocol bits.

In a second general aspect of the present invention, a method is disclosed for efficiently programming the multi-core processor disclosed in the first general aspect. According to the disclosed method, application software is partitioned into a plurality of different modules according to the programmer's design, and is analyzed by an automatic tool, such as a compiler, to determine the required data flow between different modules. Hardware resource groups of different sizes and different capability are then assigned to these modules according to their requirements. Finally, another automatic tool is used to generate machine code for each module running on the target hardware group.

This process of partitioning software into a plurality of different modules based on the programmer's design and then mapping them to corresponding hardware machine code can be used to program the disclosed hardware resources so as to conform to the requirement of a wide range of software applications.

In embodiments, the disclosed method includes the steps of:
partitioning of the application software into separate modules that form a dependency graph where the edge of the graph represents data flow between modules;
deciding on whether these modules execute in series on some hardware, in program-driven parallel on different hardware, or in data-driven parallel on different hardware;
estimating the computational requirements of the modules and the data flow requirement between the modules;
assigning hardware computation resources to each module in two dimensions, including the specific processing unit used and the time required by each unit based on the computational requirements plus a small overhead;
assigning data routing resources in two dimensions, including specific cognitive data routing network units and cognitive on-chip network units and the time that is required based on the data flow requirement plus a small time overhead; and
using an automatic tool to generate the machine codes for the hardware units.

In various embodiment, the method to decide on the timing of module executions includes applying the following rules:
only application programs with multiple sets of input can execute in data-driven parallel on different hardware;
modules with no data flow between them can execute in parallel on different hardware without taking up cognitive data routing network resources and cognitive on-chip network resources;
modules with data flow between them can execute in parallel on different hardware with usage of cognitive data routing network resources and cognitive on-chip network resources; and
by default, all modules can execute in series on the same hardware.

In certain embodiments, the compiler partitions part or all of an application software program into modules that execute in series in the same hardware group, and assigns different execution times to different modules, with the execution time being the sum of all the execution times of all the modules.

In other embodiments, the compiler partitions part or all of an application software program into modules having similar execution times that execute in program-driven parallel and assigns them to hardware groups of varying sizes, and then configures the cognitive data routing network and cognitive on-chip network to provide data flow between the modules with proper timing if data flow between the modules is required.

In still other embodiments, the compiler partitions the part or all of an application software program with multiple sets of input data into modules having similar execution times that execute in data-driven parallel and assigns hardware groups of varying sizes to all the modules, and then configures the cognitive data routing network and cognitive on-chip network to provide data flow between the modules with proper timing. The resulting program will have increased throughput because the entire application is broken into a plurality of separate functions.

In various embodiments, the compiler analyzes the required data flow between modules and determines whether the data flow is synchronous or asynchronous. For data flow from a sender to a receiver, if the rate of data production for the sender is or can be made equal to the rate of consumption of data for the receiver, it is configured as a synchronous data flow. Otherwise, if the rate of data production for the sender cannot be made equal to the rate of data consumption for receiver, it is configured as an asynchronous data flow. A synchronous data flow can be implemented without the assistance of the protocol channel to save resource usage, whereas an asynchronous data flow must be implemented with the assistance of the protocol channel.

In embodiments, the compiler analyzes each module and generates a dependency graph of intrinsic operations that are available in the architecture. The intrinsic operations can then be connected using the cognitive data routing network in an order that matches the order in the dependency graph, while independent operations can be executed in parallel based on the availability of operation components.

In various embodiments, after the compiler has completed its analysis, the automatic tool generates the machine code using a search algorithm with heuristics to meet the application requirements while optimizing specific memory space usage and/or clock cycle usage for each specific module.

A third general aspect of the present invention addresses the problem that CPU instructions in current processor designs require that a new instruction is fetched, decoded, and executed in every clock cycle, which consumes a large amount of energy. According to this third general aspect, a Time Field that specifies the number of clock cycles for which only one instruction fetch and decode will be performed is added to the instruction format that is used for all programming units.

A first general aspect of the present invention is a reconfigurable and programmable multi-core processor architecture that can be configured and programmed to conform to the requirement of a wide range of applications. The processor includes a plurality of processing units capable of executing intrinsic operations, a plurality of memory blocks, a plurality of cognitive data routing units that can be configured or programmed to route data from any of the processing unit to any of the memory blocks, from any of the processing units to any other of the processing units, from any of the memory blocks to any of the processing units, and from any of the memory blocks to any other of the memory blocks, a cognitive on-chip network comprising a network of ports, each port comprising a data channel and a protocol channel, the network being able to connect ports together by connecting the output data channels to the input data channels and the bi-directional protocol channels to each other, the cognitive data routing units and the cognitive on-chip network being able to form communication channels between the processing units with or without assistance from the memory blocks.

In embodiments, the communication channels are able to route multi-bit conditions along with data between the processing units.

In any of the preceding embodiments, the intrinsic operations executable by the processing units can include at least one of multiplication, addition, subtraction, left shift, right shift, and normalization. And in some of these embodiments the processing units can perform any combination of some or all of the intrinsic operations in any order by using the self-routing cognitive data network to connect the operations together, the sequence of operation being variable to fit the requirements of application software and reduce overall operation delays.

In any of the preceding embodiments, the processor can be configured such that the communications channels can be formed by the cognitive on-chip network by at least one of setting control registers, and setting forwarding tags associated with data.

In any of the preceding embodiments, the processor can be configured such that a communication channel can be initially configured by setting control registers, after which processing units that are sending or receiving data can add forwarding tags to the data that match the control register bits, thereby specifying usage of the communication channel.

In any of the preceding embodiments, the processor can be configured such that the communication channels can be configured and reconfigured under software control between synchronous transmission and asynchronous transmission of data and parameters.

In any of the preceding embodiments, the processor can be configured such that at least one of the bi-directional protocol channels can be defined to represent any user-defined protocol, so as to ensure that a proper batch of data is being processed.

In any of the preceding embodiments, the processor can be configured such that the communication channels can be configured and reconfigured by software for asynchronous transmission any of circular buffer, FIFO, stack, mail box, semaphore, and event triggered transmission data, and the protocol channels can be configured and reconfigured by software to transmit forward protocol channel bits that can be defined as any of valid, ready, next batch, end of transmission, and write enable, and backward protocol channel bits that can be defined as any of hold, full, and read enable.

In any of the preceding embodiments, the processor can be configured such that the protocol channels are able to generate outgoing protocol channel bits based on receipt of input protocol bits.

A second general aspect of the present invention is a method of configuring and programming a multi-core processor for execution of application software. The method includes providing a reconfigurable and programmable multi-core processor architecture that can be configured and programmed to conform to the requirement of a wide range of applications. The processor includes a plurality of processing units capable of executing intrinsic operations, a plurality of memory blocks, a plurality of cognitive data routing units that can be configured or programmed to route data from any of the processing unit to any of the memory blocks, from any of the processing units to any other of the processing units, from any of the memory blocks to any of the processing units, and from any of the memory blocks to any other of the memory blocks, a cognitive on-chip network comprising a network of ports, each port comprising a data channel and a protocol channel, the network being able to connect ports together by connecting the output data channels to the input data channels and the bi-directional protocol channels to each other, the cognitive data routing units and the cognitive on-chip network being able to form communication channels between the processing units with or without assistance from the memory blocks.

The method further includes partitioning the application software into a plurality of separate modules that form a dependency graph having an edge that indicates data flow between the modules, determining which modules should be executed in series on common hardware, in program-driven parallel on different hardware, and in data-driven parallel on different hardware, according to the following rules, only modules having multiple sets of inputs can execute in data-driven parallel on different hardware, modules having no data flow between them can execute in parallel on different hardware without using cognitive data routing network resources or cognitive on-chip network resources, modules having data flow between them can execute in parallel on different hardware with usage of cognitive data routing network and cognitive on-chip network resources for routing data between the different hardware, and all modules can execute in series on same hardware, estimating a computation requirement for each of the modules, estimating data flow requirements between the modules, assigning hardware computation resources to each of the module in two dimensions according to specific processing units used by each module and computational time requirements based on the determined computation requirement in addition to a specified time overhead, assigning data routing resources in two dimensions, according to specific cognitive data routing units and cognitive on-chip network units and the data flow time requirements based on the determined data flow requirements in addition to a specified time overhead, and using an automatic tool to generate machine code for execution by the processor.

In embodiments, the method includes partitioning a module into submodules that execute in series, and assigning the same hardware group and different execution times to each of the submodules, whereby an execution time of the module is a sum of the execution times of the submodules.

In any of the preceding embodiments, the method can include partitioning the application software into modules having similar execution times that execute in program-driven parallel, assigning hardware groups of varying sizes to the modules, and configuring the cognitive data routing units and cognitive on-chip network for data flow between the modules, said data flow having a required timing if data flow between the modules is included.

In any of the preceding embodiments, the application software can require a plurality of sets of input data, and the method can include partitioning the software into modules having similar execution times that execute in data-driven parallel, assigning hardware groups of varying size to the modules, and configuring the cognitive data routing units and cognitive on-chip network for data flow between the modules having a required timing.

In any of the preceding embodiments, the method can include analyzing data flow between the modules and determining whether the data flow is synchronous or asynchronous, whereby for a data flow from sending module to a receiving module, if a rate of production for the sending module is equal to or can be made equal to a rate of consumption of the receiving module, the data flow is a synchronous data flow, if the rate of production is not equal to and cannot be made equal to the rate of consumption, the data flow is an asynchronous data flow, a synchronous data flow can be implemented without assistance from a protocol channel, and an asynchronous data flow requires assistance from a protocol channel.

In any of the preceding embodiments, the method can include analyzing each module and generating a dependency graph of intrinsic operations that are available in the architecture, whereby the intrinsic operations can then be interconnected in an order that matches the dependency graph using the cognitive data routing network and independent operations can be executed in parallel based on availability of hardware resources.

In any of the preceding embodiments, an automatic tool is used to generate the machine code using a search algorithm with heuristics to meet requirements of the application software while optimizing at least one of memory space usage and clock cycle usage for each module.

A third general aspect of the present invention is a reconfigurable and programmable multi-core processor architecture comprising at least one programmable unit that can be programmed using instructions that include a Time Field that specifies a number of clock cycles during which only a single instruction fetch and decode will be performed.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 13A illustrates the instruction content of a present-day CPU; and

FIG. 13B illustrates the instruction content for programmable units in embodiments of the present invention.

DETAILED DESCRIPTION

As explained in more detail above, present-day single-core processors uses a variety of different methods in an attempt to optimize their efficiency in executing certain specific software programs. However, due to the fundamental limitations of a pipelined architecture, when one aspect is optimized, other aspects cannot be simultaneously optimized, resulting in inefficient SoC designs that include large number of cores with different architectures. As a result, present day multi-core processors have very low efficiency because of their necessarily poor data synchronization.

Underlying embodiments of the present invention as disclosed herein is a very different strategy for improving both single-core efficiency and multi-core efficiency. First, a cognitive data routing network is used to allow any operations to execute either in series or in parallel in any order, thereby improving the efficiency of the programmable processing units. Second, the processing units can be programmed independently as separate processors, or they can be configured to operate in synchronization as an SIMD processor or VLIW processor, so as to have better efficiency than present-day single core processors. In addition, cognitive on-chip network units are included which manage data flow and synchronize channels between different modules of the software application, so as to minimize buffering requirements and improve multi-core efficiency.

Figure 1:
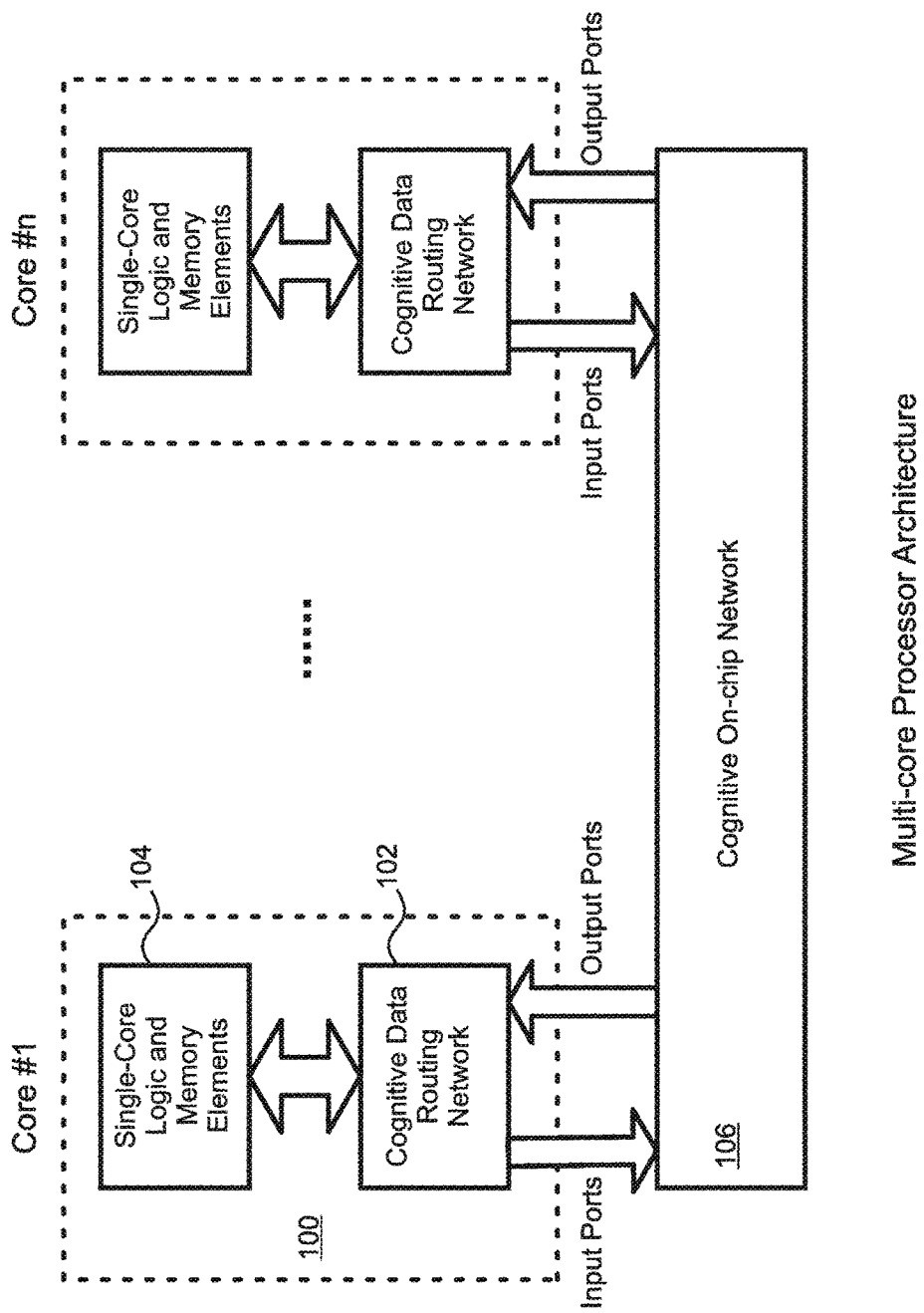
FIG. 1 is a functional diagram illustrating the basic structure of a multi-core processor in an embodiment of the present invention.

FIG. 1 illustrates the basic structure of a multi-core processor according to embodiments of the present invention. Each "core" 100 includes a cognitive data routing network unit 102 and a logic and memory element 104 connected to the cognitive data routing network 102. The cognitive data routing network 102 also provides data connectivity to the cognitive on-chip network 106.

Figure 2:
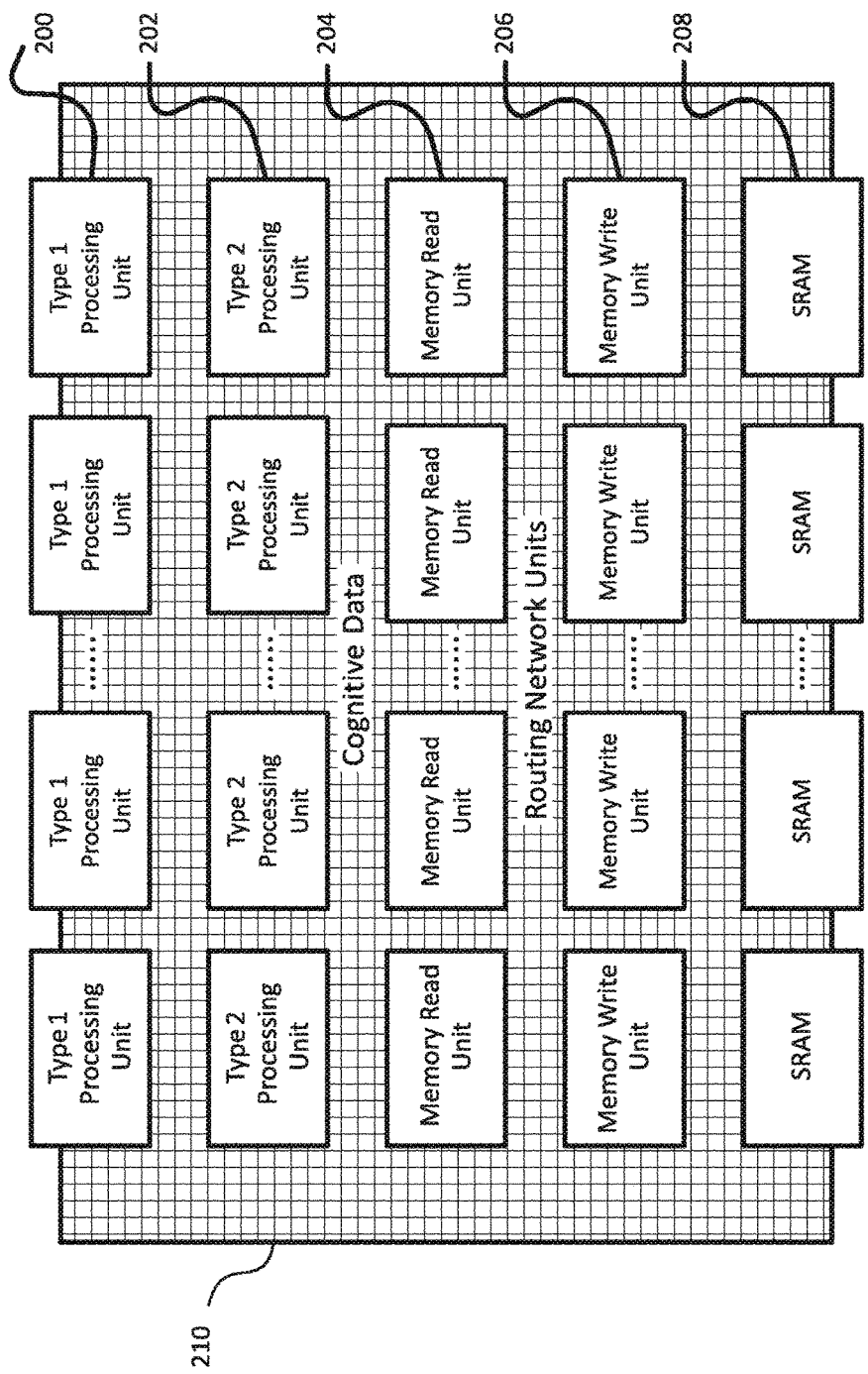
FIG. 2 is a functional diagram illustrating the basic structure of a single-core processor in an embodiment of the present invention.

FIG. 2 illustrate the structure of a single-core processor according to an embodiment of the invention. The processor includes a plurality of processing units 200, 202 that are capable of intrinsic operations used commonly by applications, as well as a plurality of memory read units 204, memory write unites 206, and memory blocks 208. The processor also includes cognitive data routing network units 210 that can be configured or programmed to route data from any processing unit 200 or 202 to any memory block 208 through Memory Write Units 206, from any processing units 200 or 202 to any other processing units 200 or 202, from any memory block 208 to any processing unit 200, 202 through Memory Read Units 204, or from any memory block 208 to any other memory block 208. In embodiments the network can also route multi-bit conditions along with the data.

Figure 3:
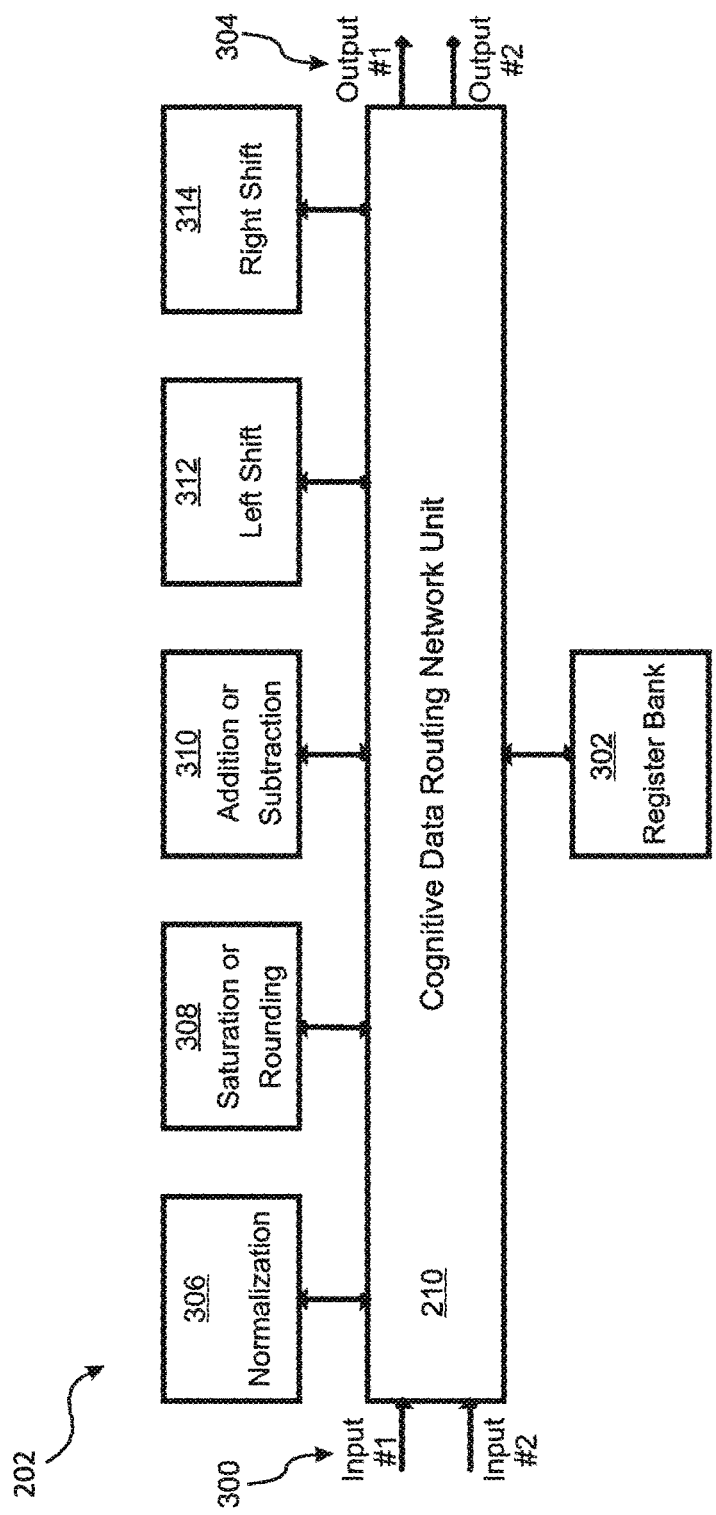
FIG. 3 is a functional diagram illustrating the structure of a type 2 processing unit in an embodiment of present invention.

FIG. 3 illustrates a type 2 programmable processing unit 202 in an embodiment of the invention. The processing unit 202 includes a plurality of inputs 300, a plurality of outputs 304, a set of operation units 306-314, and a register bank 302, all of which are interconnected through the cognitive data routing network 210. In various embodiments, type 2 Processing units 202 are capable of intrinsic operations such as multiplication, addition, subtraction, left shift, right shift, and normalization. In embodiments, the type 2 processing units 202 can perform any combination of some or all of these operations, in any order, using the self-routing cognitive data network 106 to interconnect the operations. According to the embodiment, the sequence of operations can be varied to fit the requirements of the application software, and to reduce the overall operation delays. For example, the embodiment illustrated in FIG. 3 is adaptable to the following two types of programs, both having single cycle throughput with different delays.

$$\text{out}=\text{round}((\text{in1}+\text{in2})>>3)<<4; \tag{1}$$

$$\text{out1}=(\text{in1}+\text{in2})>>3; \text{out2}=\text{round}(\text{reg1}<<4) \tag{2}$$

Using present day single-core processors, it would be possible to optimize the throughput efficiency of one of these programs, but not both of them, due to the rigid pipeline structure of the processor. In contrast, the structure provided by embodiments of the present invention allows both programs to be optimized simultaneously.

Figure 4:
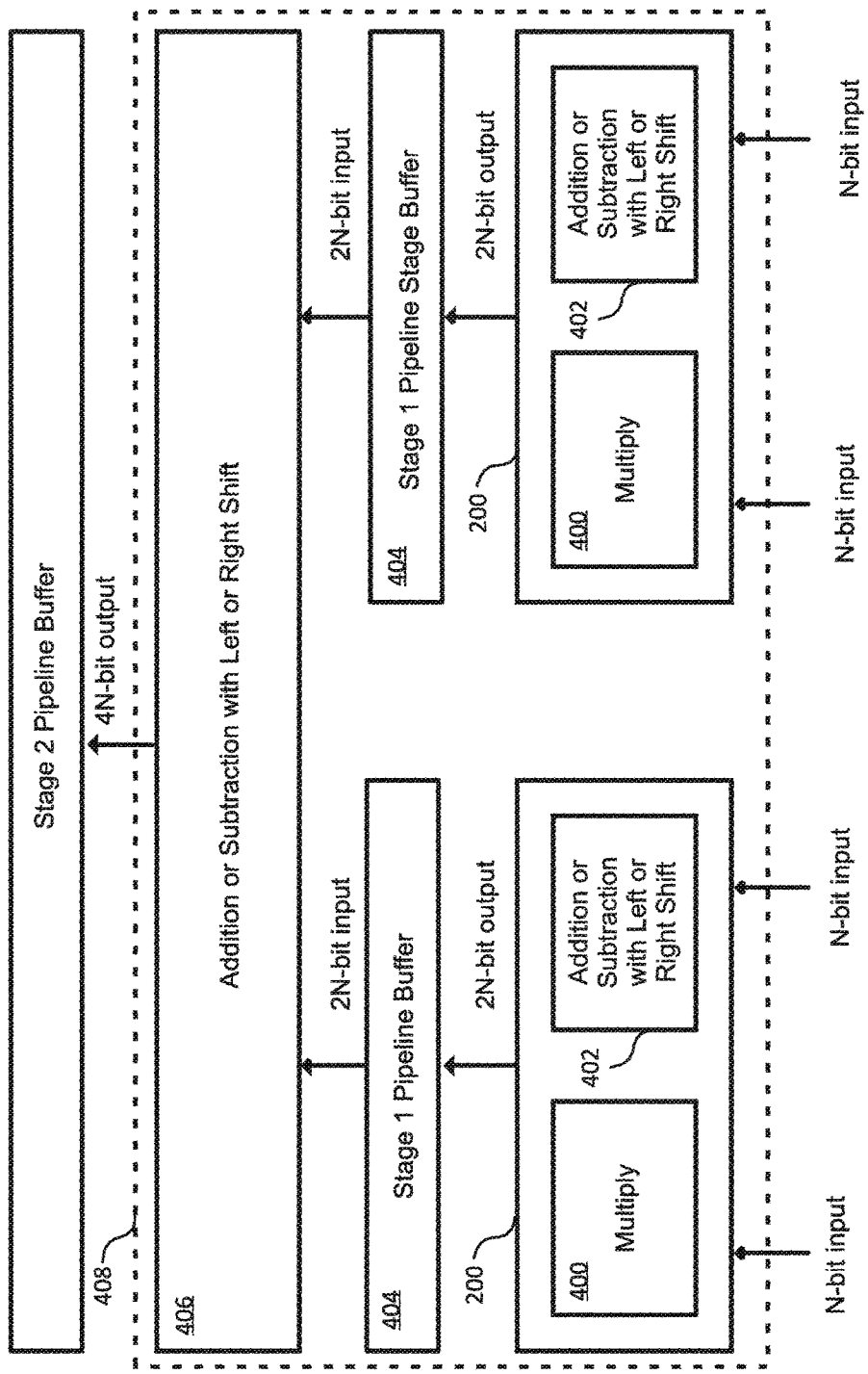
FIG. 4 is a functional diagram illustrating the structure of a type 1 processing unit in an embodiment of present invention.

FIG. 4 illustrates a type 1 programmable processing unit 200 in an embodiment of the invention. The unit 100 includes multiply 400, addition, and shift circuitry 402. Two lanes of N-bit type 1 processing units can be combined with additional circuitry 404, 406 to form a larger 2N-bit type 1 processing unit 408. If the N-bit type 1 processing unit 200 is capable of N-bit addition with shift or N-bit by N-bit multiplication, then the 2N-bit processor 408 is capable of 2N-bit addition with shift or 2N-bit by N-bit multiplication. Or two lanes of 2N-bit type 1 processor units 200 can be combined with additional circuitry 404, 406 to form a 4N-bit type 1 processor unit 408 that is capable of 4N-bit addition with shift or 2N-bit by 2N-bit multiplication.

Figure 5B:
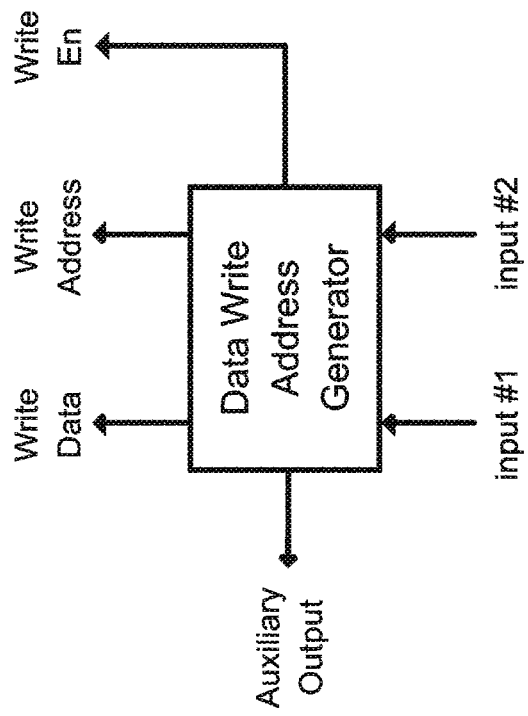
FIG. 5B is a functional diagram illustrating the structure of a data write unit in an embodiment of present invention.
Figure 5A:
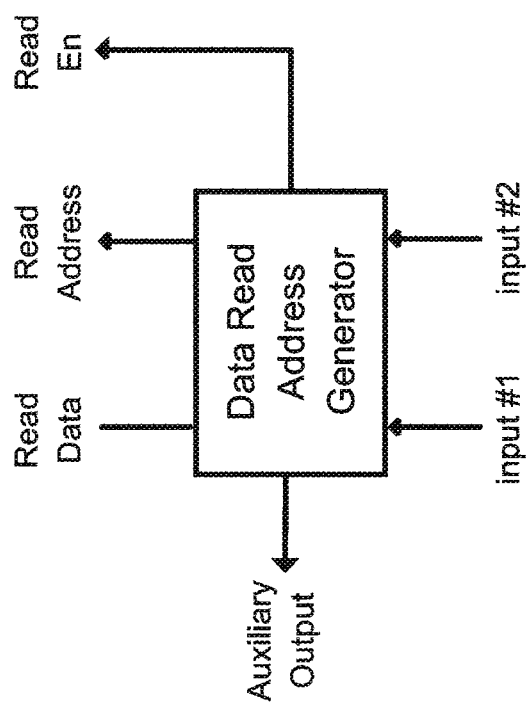
FIG. 5A is a functional diagram illustrating the structure of a data read unit in an embodiment of present invention.

FIGS. 5A and 5B illustrate the input and output configurations of the data read units and data write units in embodiments of the invention. All of the inputs and outputs are connected to the cognitive data-routing network 210.

Figure 6:
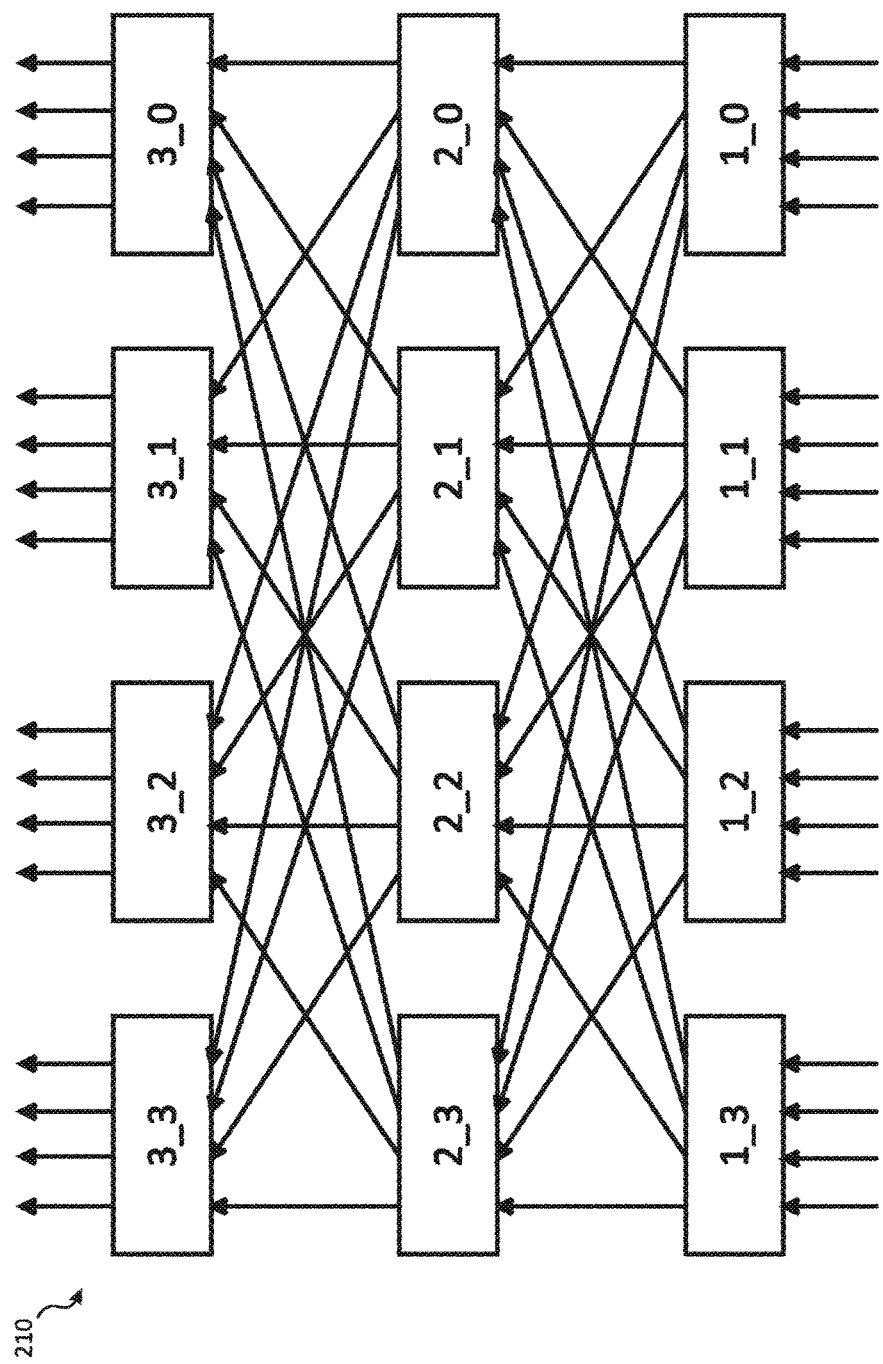
FIG. 6 is a functional diagram illustrating the architecture of a cognitive data routing network unit in an embodiment of present invention.

FIG. 6 illustrates the structure in an embodiment of the cognitive data routing unit 210. This unit 210 allows any input to be connected to any output for a single input to single output configuration. Single input to multiple output configurations can also be provided if there are fewer inputs than outputs, and multiple input to multiple output configurations can also be provided if there are fewer outputs than inputs. In embodiments, the cognitive network 210 can be configured to connect an input port with an output port by setting the control registers. In other embodiments, the cognitive data routing network 210 can be configured to route data from an input to an output by setting a forwarding tag that is associated with data. Alternatively, in various embodiments, when there are multiple inputs and/or multiple outputs, connections between specific inputs and specific outputs can be configured by setting control registers, and then either the sender of data or the receiver of data can add forwarding tags to the data that match the control register bits so as to specify usage of the paths.

Figure 7:
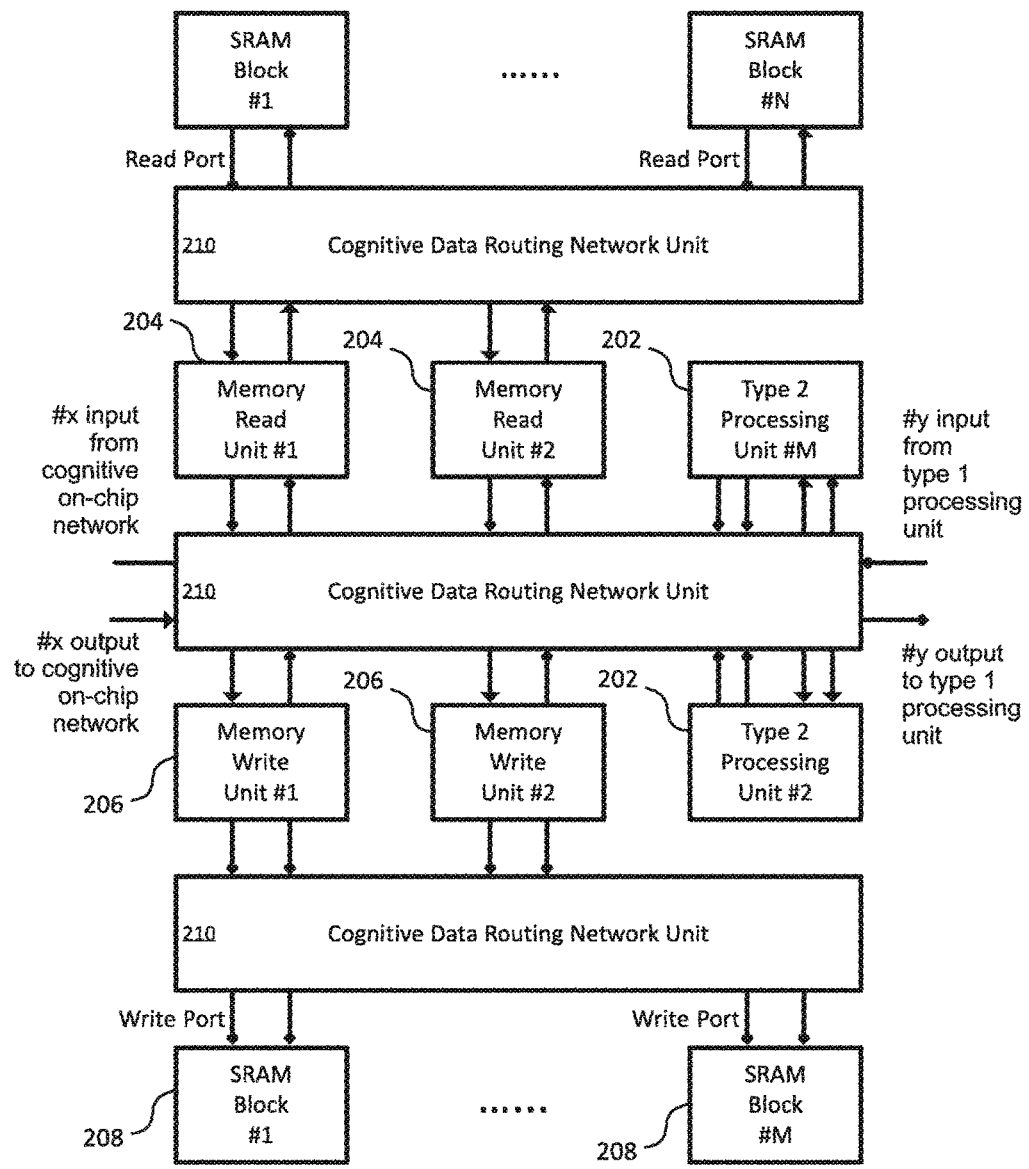
FIG. 7 is a functional diagram illustrating the basic structure of a cognitive data routing network connecting type 2 processing units, memory read units, memory write units, and SRAM blocks in an embodiment of present invention.
Figure 8:
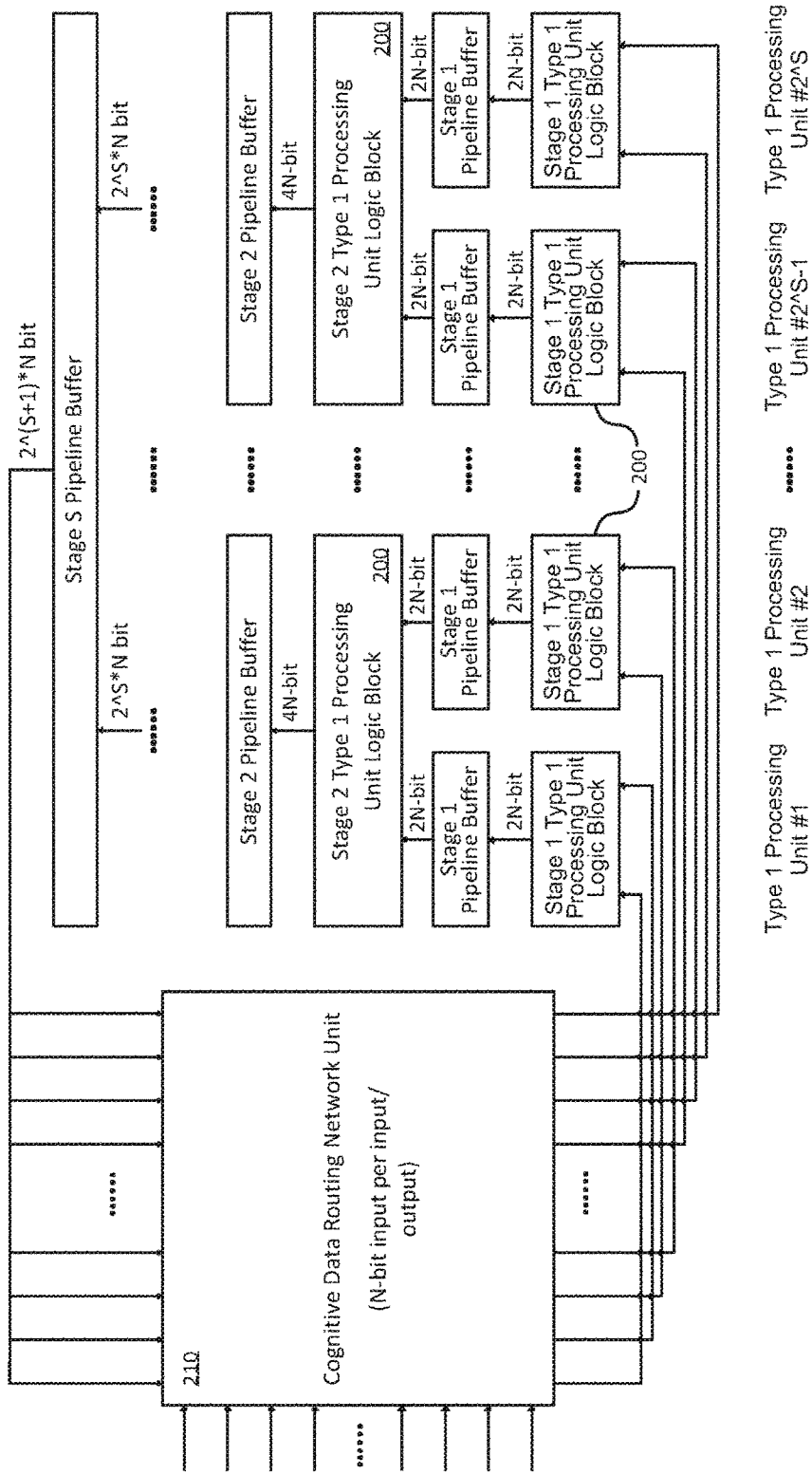
FIG. 8 is a functional diagram illustrating the basic structure of a cognitive data routing network connecting the inputs and outputs of type 1 processing units in an embodiment of present invention.

Two examples of usage of cognitive data routing networks are illustrated in FIGS. 7 and 8. In FIG. 7, two memory read units 204, two memory write units 206, and two type 2 processing units 202 are connected via three cognitive data routing network units 210 to M SRAM blocks 208. The outputs and inputs to and from the on-chip network 210 and type 1 processing units 200 are also connected to cognitive data routing network units 210. Each of the SRAM blocks 208 in this embodiment can be configured to store either data or instructions.

As an example, assume that the M SRAM blocks 208 each have $2^K$ N-bit words storage capacity, and the local address of each SRAM block 208 is a K-bit word. The M SRAM blocks 208 can each be given a unique L-bit word as its forwarding tag. If any of the memory read units 204 or memory write units connecting to the cognitive data routing network units 210 wants to access a specific SRAM block 208, it just appends the unique L-bit forwarding tag of the SRAM block 208 to the read or write address. If a unit wants to access more than one SRAM block 1, 1+1 it first initialize the address generator to $1*2K$. Then the top L bits of the address generator are used as the forwarding tag attached to the read or write address, while the lower K bits are used as the local SRAM address.

When the address generator computes an address between $1*2^K$ and $(1+1)*2^K$, it will automatically access SRAM block 1+1. Similarly, additional SRAM blocks 208 can be connected this way. This method connects SRAM block 1 and SRAM block 1+1 in series. Alternatively, SRAM block 1 and SRAM block 1+1 can be connected in parallel by initializing the lower L bits of the address generator to 1 and using the top K bits as the local address. But it is only possible to connect 2, 4, 8, . . . SRAM blocks together in parallel. In such a manner, the M SRAM blocks 208 can be allocated to any memory read unit or memory write unit in any proportion.

A similar mechanism is used in embodiments to connecting ports using the cognitive data-routing network unit 210. Each output port in the system has a unique P bit port number. When all of the output port to input port connections can be determined by one program either on the input side or on the output side, the network can be established by setting the control registers of the input ports to the desired output port numbers. Alternatively, if the output port to input port connections cannot be determined by one program, then the network can be configured by setting the control registers of the input ports to the output port numbers, so as to allow connections between the output ports and specific input ports. The sender of the data can then attach a forwarding tag which matches the desired output port number to the transmitted data, so as to send data to the desired output port. Also, in embodiments a plurality of input ports can be connected to the same output port, and the receiver of the data can further select which input ports it will receive data from.

FIG. 8 illustrates a structure that uses the cognitive data routing network 210 in an embodiment to connect the output ports with input ports of type 1 programmable processing units. It uses the same mechanism as described above for FIG. 7.

Since the SRAM block 208 can be configured to store either data or instructions, structure illustrated in FIG. 8 offers superior flexibility over present processors. If more SRAM blocks 208 are configured for instruction storage than for data storage, programs can be accommodated with very complex operations and minimal intermediate data storage requirements. In embodiments it is also possible to configure more SRAM blocks 208 for data storage than for instruction storage, to provide higher efficiency for programs with large intermediate data storage requirements but simple operations. Or approximately equal numbers of SRAM blocks 208 can be allocated between data storage and instruction storage.

The structure of the cognitive data-routing network 210 illustrated in FIG. 8 also provides flexibility in configuring embodiments of the present invention for "simple instruction, multiple data" (SIMD) and "very long instruction word" (VLIW) type operations. For example, two SRAM blocks 208 can be configured for instruction storage for two type 2 processing units 202. When the same instruction is being executed by both type 2 processing units 202, the forwarding tags of the SRAM blocks 208 can be configured to make them connect in series and provide twice the storage capacity. The two type 2 processor units 202 then operate in SIMD mode. If different instructions are being executed by the two type 2 processing units 202, each SRAM block 208 can be configured to connect to one type 2 processor unit 202. The two type 2 processing units 202 then operates in VLIW mode. Embodiments of the present invention thereby offer flexibility in SIMD and VLIW operation modes, with the SIMD operation mode having more instruction storage capacity, thereby improving the hardware efficiency and adaptability.

Present day processors typically have a defined "word size" that is reflected in the "bit-width" of the parallel data paths included in the processor. For example, 32-bit processors have 32-bit datapaths, and 64-bit processors have 64-bit datapaths. If the width of an item of data is less than the defined word size, it still must be communicated within the processor over a datapath having the defined 32 bit or 64 bit width. This is inefficient for application programs that process large amounts of data organized as 8-bit bytes or 16-bit words. Embodiments of the present invention use the cognitive data routing network 210 to solve this problem. For example, since the output and input ports of a type 1 processor 200 are connected by a cognitive data routing network 210, the network can route 16-bit data, 32-bit data, 64-bit data, and higher-bit data from any output to any input, thereby matching the configuration of the type 1 processing units 200.

Figure 9:
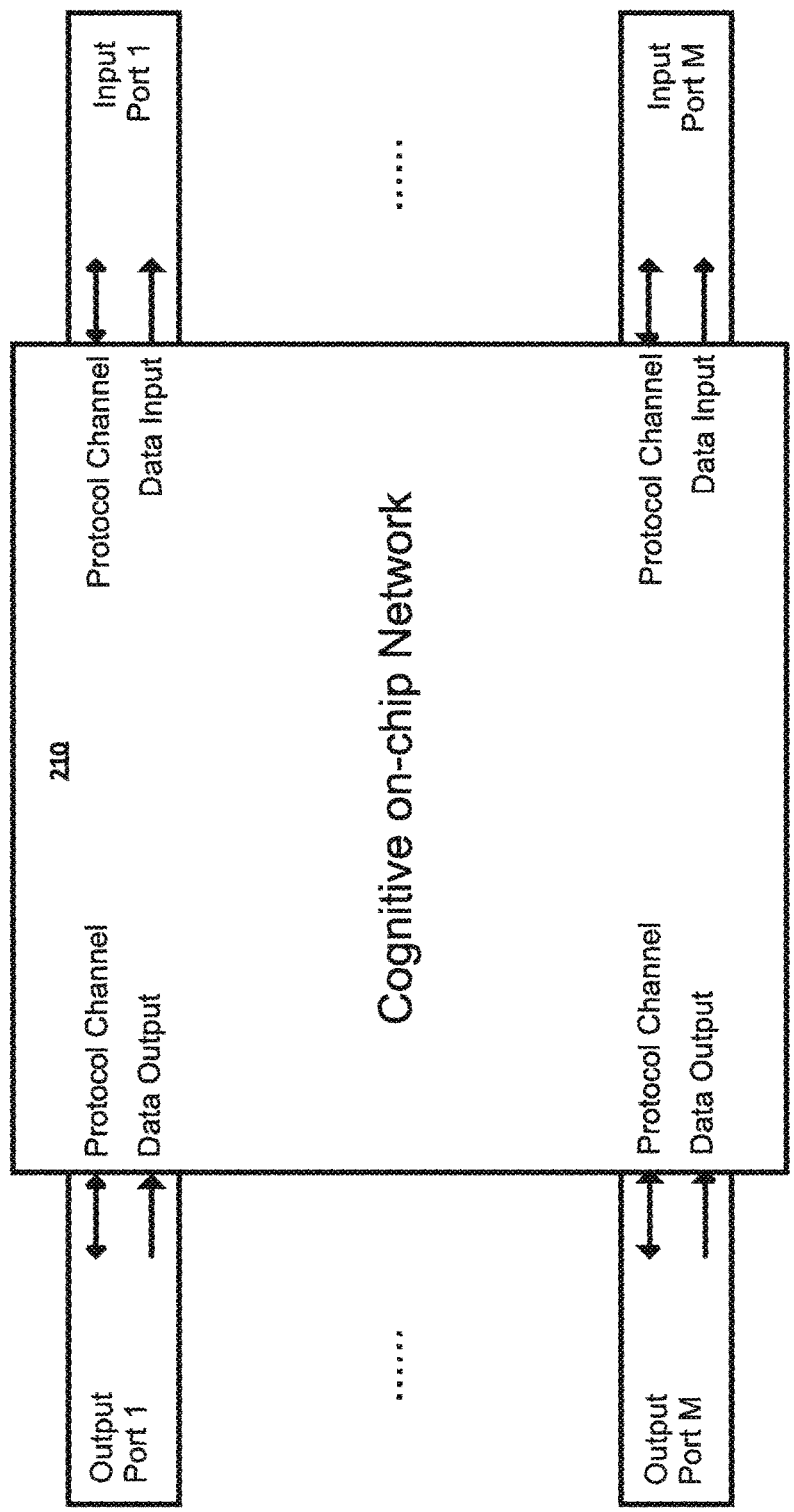
FIG. 9 is a functional diagram illustrating the basic structure of a cognitive on-chip network that is used for connecting different single-cores in an embodiment of present invention.

FIG. 9 illustrates the structure of a cognitive on-chip network 210 in an embodiment of the invention. The network 210 can be used to establish a connection between two ports for synchronous transmission and/or asynchronous transmission of data and parameters, depending on the requirements of the application software. The network 210 connects the data channels from the output ports to the input ports. It also connects the bi-directional protocol channels to pass forward and backward protocol bits. The forward and backward protocol bits can be defined by a programmer to represent any protocol. The defined protocols can be used to ensure that the proper batch of data is being processed. The data and protocol channel can be set up for asynchronous transmission of data, such as circular buffer, FIFO, stack, mail box, semaphore, or event triggered transmission, etc. The forward protocol channel bits can be defined as valid, ready, next batch, end of transmission, write enable, etc. The backward protocol channel bits can be defined as hold, full, read enable, etc.

An example for using the cognitive on-chip network to set up an event transmission is for the transmitting unit to set a "ready" signal simultaneously with transmitting the data to the receiving unit, whereby the network routes the data along with the "ready" signal from the transmitting unit to the receiving. When the receiving unit receives the "ready" signal, it initiates its program to process the data.

If necessary, the receiving unit can also notify another processing unit to start processing data X cycles after receiving the "ready" signal. This requires that the processing unit must be capable of generating outgoing protocol channel bits based on receipt of input protocol bits.

Figure 10A:
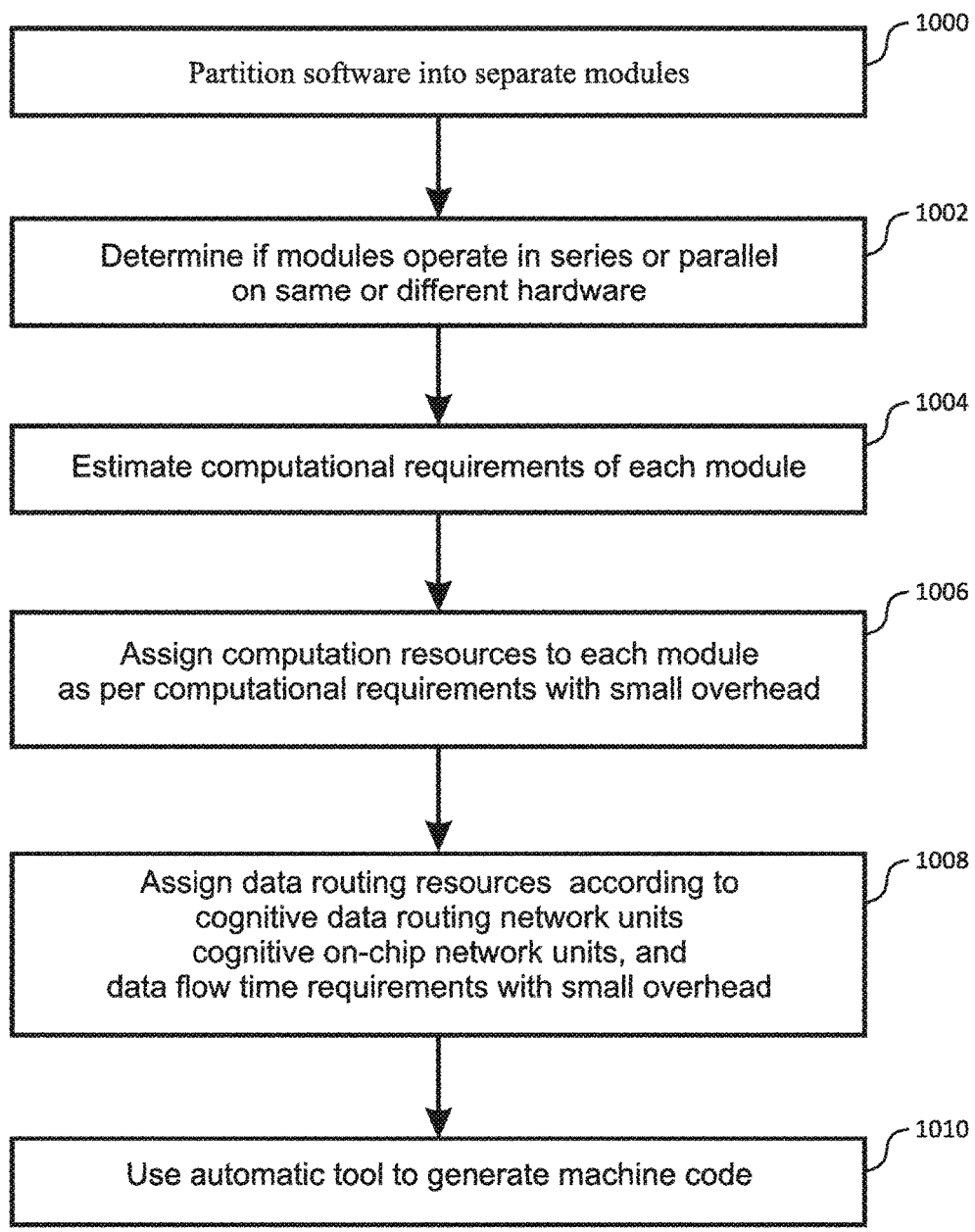
FIG. 10A is a functional diagram illustrating steps in an embodiment of the method of the present invention.

A second general aspect of present invention is a programming method for making efficient use of the disclosed multi-core processor. In embodiments, with reference to FIG. 10A, the method includes the following steps:

- Partitioning the application software into separate modules that form a dependency graph with the edge of the graph being data flow between modules 1000.
- Determining whether these modules execute in series on the same hardware, in program-driven parallel on different hardware, or in data-driven parallel on different hardware 1002.
- Estimating the computational requirements of the modules and the data flow requirements between modules 1004.
- Assigning hardware computation resources to each module in two dimensions, according to the specific processing units that are used and the time requirements based on the computation requirements plus a small time overhead 1006.
- Assigning data routing resources in two dimensions, according to the specific cognitive data routing network units, the cognitive on-chip network units, and the time requirements based on the data flow requirements plus a small time overhead 1008.
- Using an automatic tool to generate the machine code for the hardware units 1010.

The following rules are used in embodiments to determine whether the modules will execute in series, in program-driven parallel, or in data-driven parallel:

1) Only application program with multiple sets of inputs can execute in data-driven parallel on different hardware.

2) Modules that do not require data flow between them can execute in parallel on different hardware without consuming cognitive data routing network resources or cognitive on-chip network resources.

3) Modules that require data flow between them can execute in parallel on different hardware with usage of cognitive data routing network resources and cognitive on-chip network resources between the different hardware.

4) By default, all modules can execute in series on the same hardware.

Figure 10B:
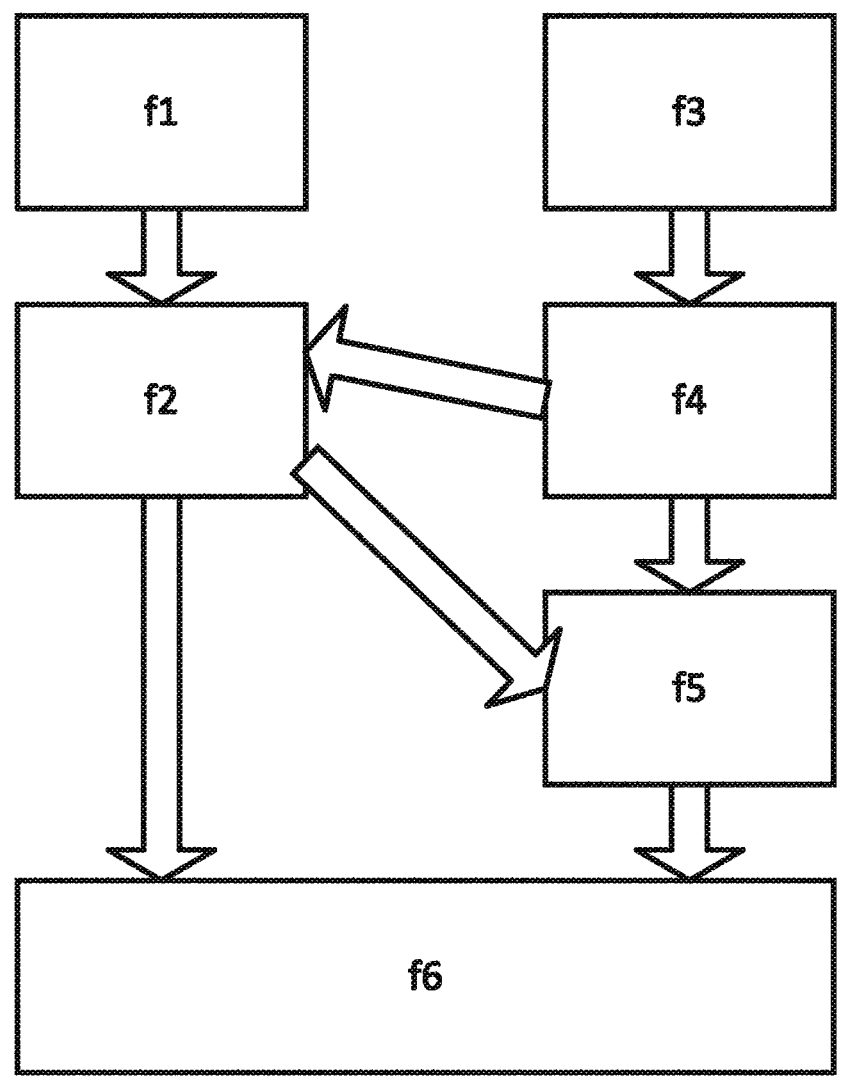
FIG. 10B is a functional diagram illustrating the partitioning of a software application into modules in an embodiment of the present invention.

The first step is partitioning the application software program. The partition can be done in terms how the programmer has partitioned the application software. FIG. 10B illustrates the partitioning of a software application into f1, f2, f3, f4, f5 and f6.

Figure 11A:
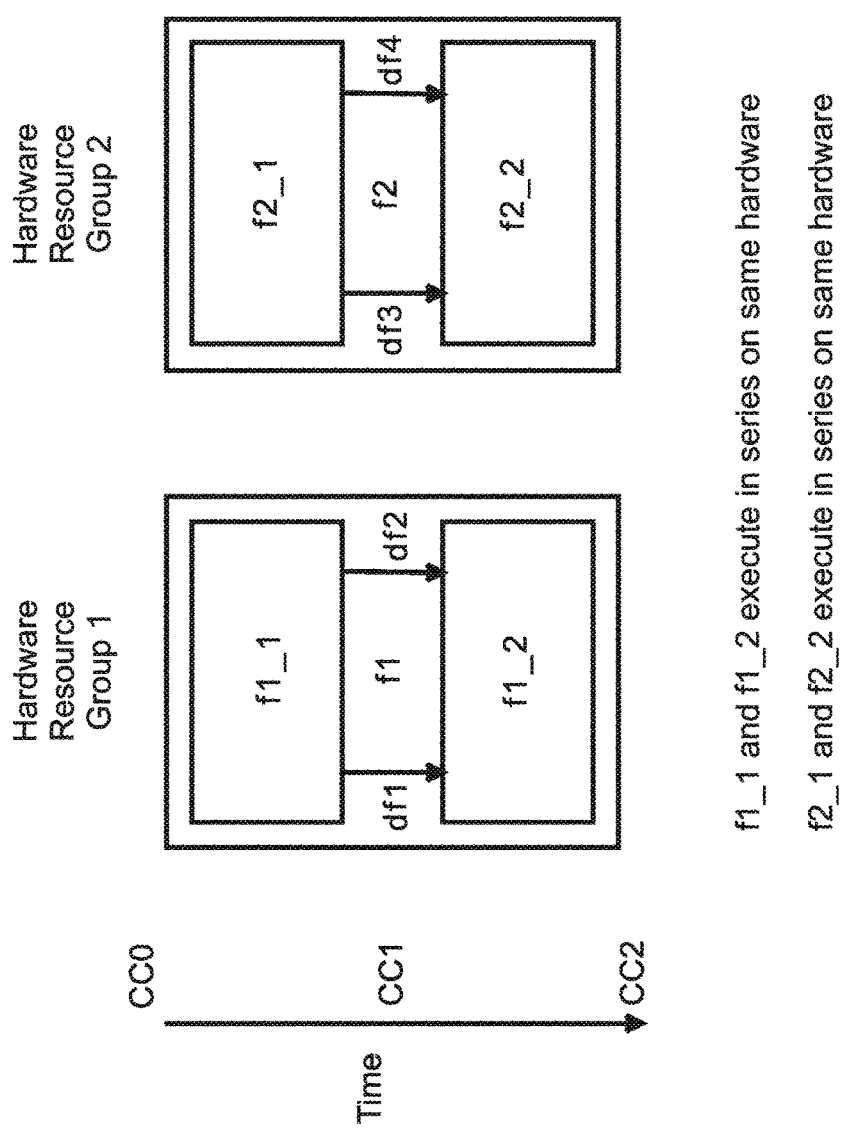
FIG. 11A is a functional diagram illustrating MPEG application software executed in data-driven parallel on different hardware resource groups in an embodiment of the present invention.
Figure 11B:
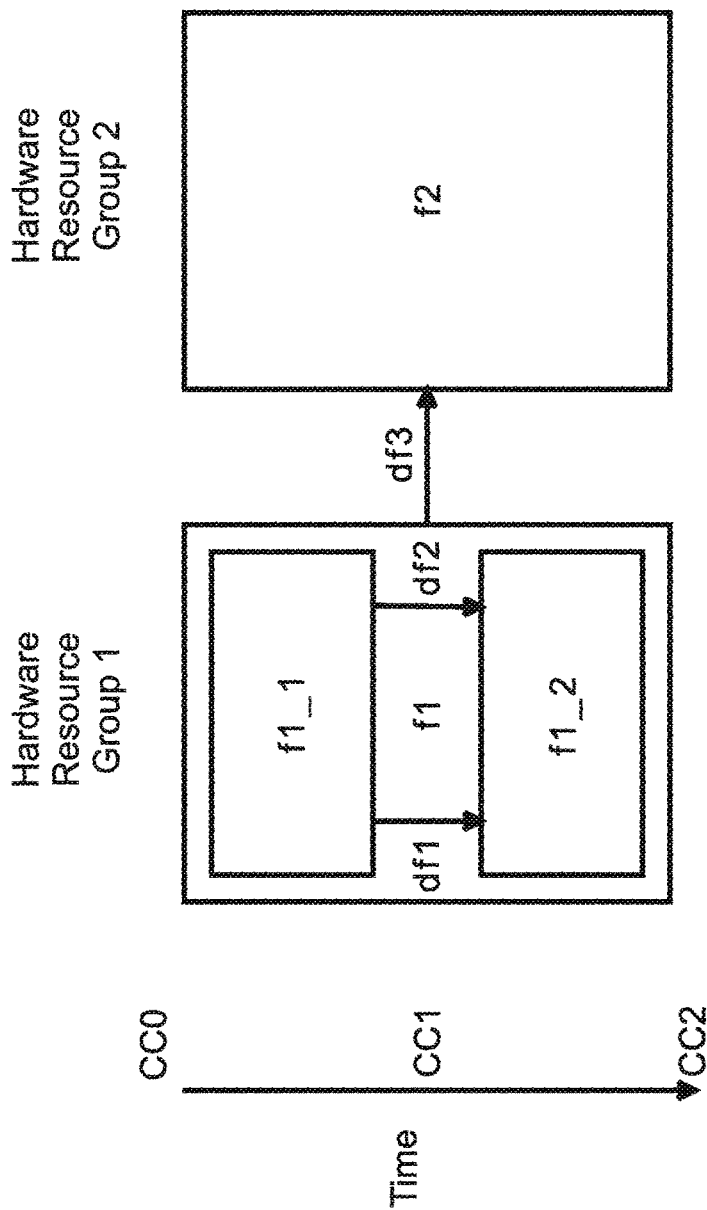
FIG. 11B is a functional diagram illustrating functions executed in data-driven parallel and program-driven parallel on different hardware resource groups in an embodiment of the present invention.

First, we examine whether the application program has multiple sets of inputs or not. For example, assume that an MPEG-2 decode program is written for a frame, and the real world application includes at least 30 frames a second that are being executed using the same program. If the application has multiple sets of input, the entire application software program can execute in data-driven parallel. FIG. 11A illustrates how different functions of the MPEG-2 decode program executes in this example in data-driven parallel on different hardware groups, each with a different batch of input data frames. FIG. 11B illustrates how different input batches execute in data-driven parallel on different hardware groups.

Sometimes, only part of a program has multiple sets of the inputs. If a program includes a "for" loop where there is no data dependency between the iterations, each iteration of the "for" loop can execute in data-driven parallel on different hardware resources.

Figure 11C:
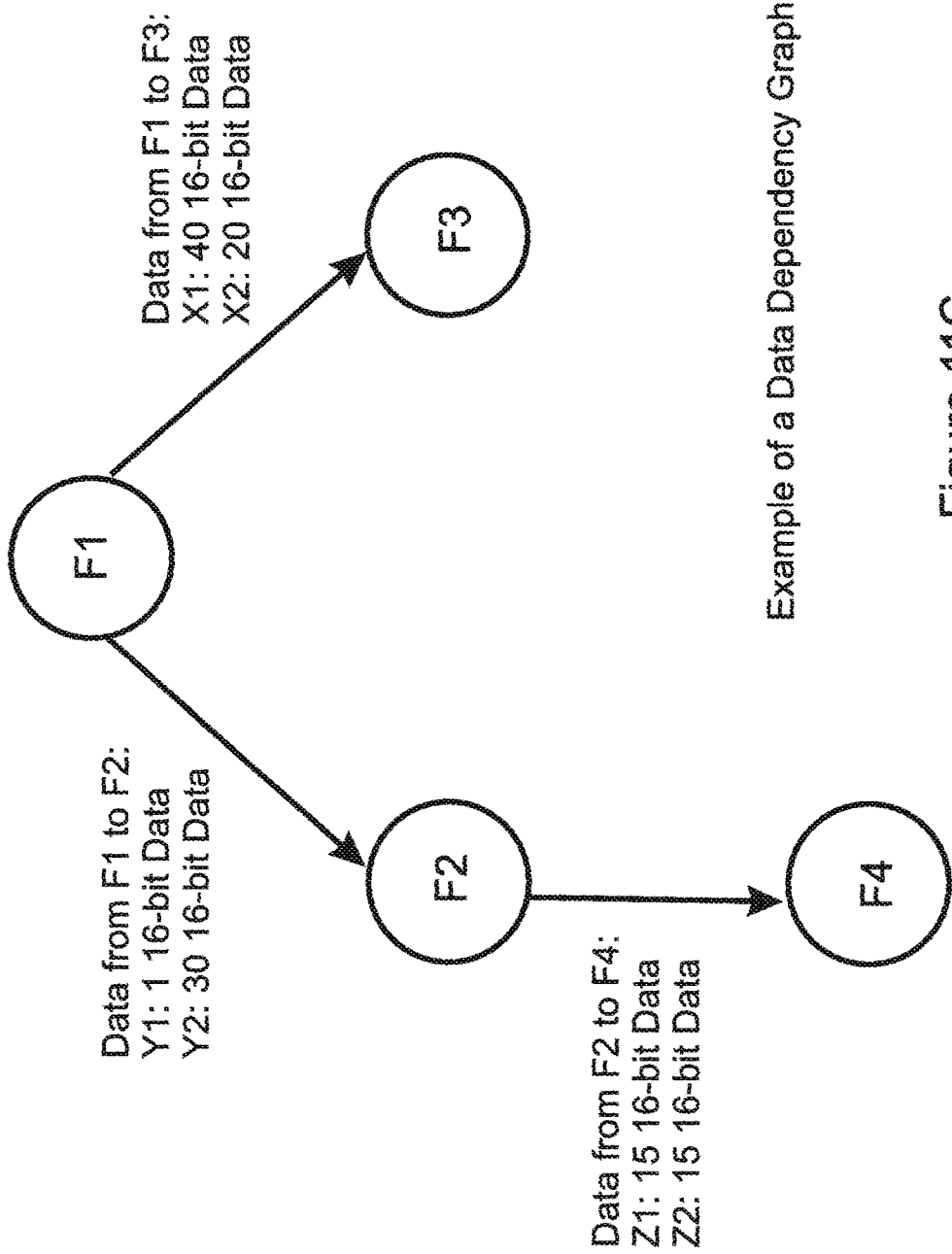
FIG. 11C is a functional diagram that illustrates an example of a data dependency graph.

For application software programs having single batches of input, a traditional compiler can be used to generate a dependency graph of the functions written by the programmer, including the data flow between the functions. FIG. 11C illustrates an example of a data dependency graph. These functions can be executed in series on same hardware by default. Then functions having no data flow between them can be selected as modules that execute in program-driven parallel on different hardware, thereby using fewer network resources. The remaining functions can then be assigned to modules that either execute in series on same hardware, or execute in program-driven parallel on different hardware, depending on what hardware resource are available.

Figure 12A:
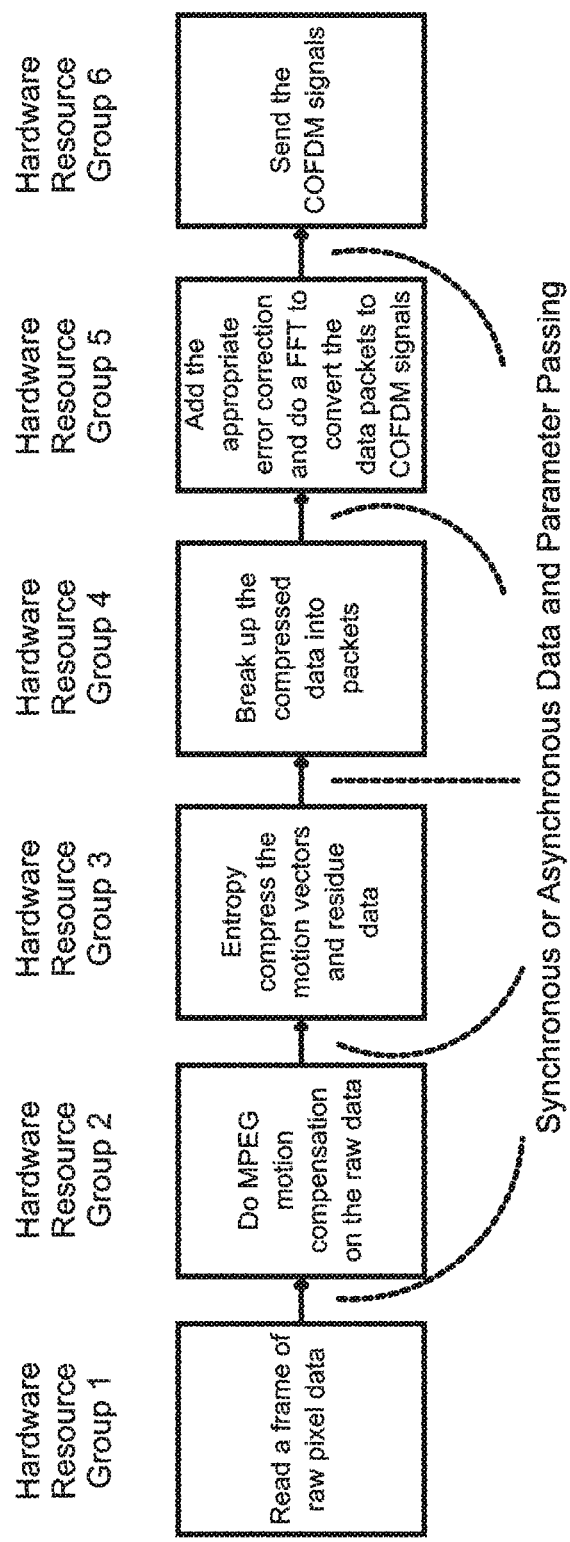
FIG. 12A is a functional diagram illustrating functions executed in series on the same hardware resource group and in program-driven parallel on different hardware resource groups with no data flow between them in an embodiment of the present invention.

FIG. 12A and Table 1 illustrate how modules can execute in series on the same hardware group, and how modules can execute in program-driven parallel on different hardware groups with no data flow between them.

TABLE 1

| Periods | Hardware Resource Group 1 | Hardware Resource Group 2 | Hardware Resource Group 3 | Hardware Resource Group 4 | Hardware Resource Group 5 | Hardware Resource Group 6 |
|---|---|---|---|---|---|---|
| 1 | Data frame 1 | | | | | |
| 2 | Data frame 2 | Data frame 1 | | | | |
| 3 | Data frame 3 | Data frame 2 | Data frame 1 | | | |
| 4 | Data frame 4 | Data frame 3 | Data frame 2 | Data frame 1 | | |
| 5 | Data frame 5 | Data frame 4 | Data frame 3 | Data frame 2 | Data frame 1 | |
| 6 | Data frame 6 | Data frame 5 | Data frame 4 | Data frame 3 | Data frame 2 | Data frame 1 |
| 7 | Data frame 7 | Data frame 6 | Data frame 5 | Data frame 4 | Data frame 3 | Data frame 2 |
| 8 | Data frame 8 | Data frame 7 | Data frame 6 | Data frame 5 | Data frame 4 | Data frame 3 |

Figure 12B:
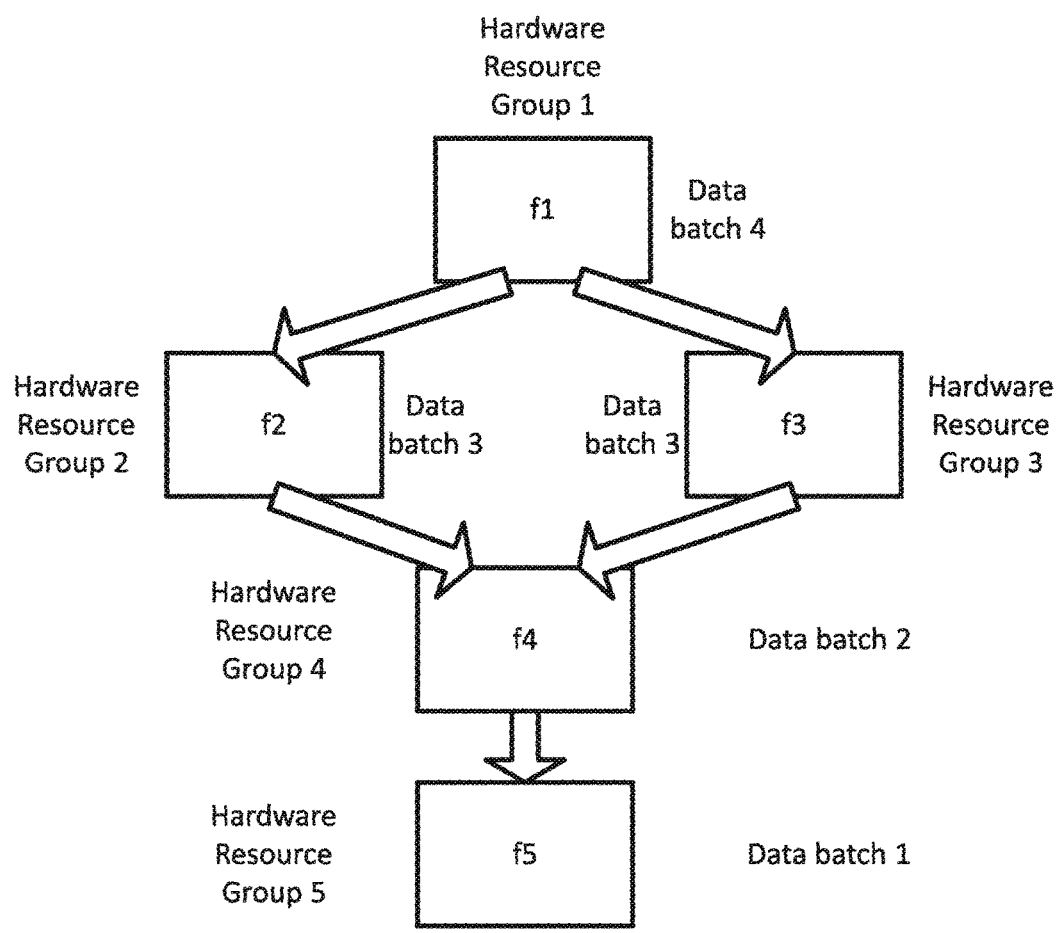
FIG. 12B is a functional diagram illustrating functions executed in series on the same hardware resource group and in program-driven parallel on different hardware resource groups with data flow between them in an embodiment of the present invention.

FIG. 12B illustrates how modules can execute in series on same hardware group and how modules can execute in program-driven parallel on different hardware groups with data flow between them. In this example, the execution time for f1_1 is CC1-CC0, the execution time for f1_2 is CC2-CC1, the execution time for f1, which is the combination of f1_1 and f1_2, is CC2-CC0, and the execution time for f2, which execute in parallel with f1, is also CC2-CC0.

The execution times for modules that execute either in program-driven parallel or data-driven parallel must be similar, so as to maximize load balancing and ensure efficient use of hardware resources. When application software is partitioned into modules, a present-day profiler can be used to estimate the number of intrinsic operations included in each module. For example, an estimate can be made for each module of the number of additions or subtractions, the number of shifts, and the number of multiplications that are included.

In many instances, intrinsic operations can be converted. For example, a left shift of n bits can be converted to a multiplication by 2^n. A 16-bit by 16-bit multiplication can be converted to 16 additions and 16 left shifts. Based on the different intrinsic operations count, the modules can then be mapped to type I or type II processing units, and the execution time can also be estimated.

A present day profiler can also be used to calculate the amount of data flow between different modules. For example, for a given instance the profiler may determine that thirty 16-bit data words need to be transferred from f1 to f2 during the time that f1 and f2 executes. The usage of cognitive on-chip data routing network resources (i.e. 16-bit channels) can also be estimated. In some embodiments, a trial-and-error method is used to arrange for modules to execute in parallel that have similar execution times. In other embodiments, an automatic tool with appropriate heuristics is used to automate the mapping of modules to resources.

For modules that execute in series, the same group of hardware resources can be assigned to all of the modules, where each module has its own execution time. Shared storage can be used to pass data between the modules. In the example of FIG. 11A and FIG. 11B, after CC1-CC0, or after f1_1 completes, the data from f1_1 to f1_2, indicated as df1 and df2, is retained in registers or in memory units until it is passed on to f1_2. Then f1_2 stores the data in registers or memory units and continues its execution. The execution time of f1 is the sum of f1_1 and f1_2, which is CC2-CC0.

For modules that execute in program-driven parallel, different groups of hardware are assigned to different modules. As described above, the programs should have similar execution times for load balancing. If the modules do not have any data flow between them, no cognitive data routing network resources or cognitive on-chip network resources need to be used. If there is data flow between the modules, then cognitive data routing network and cognitive on-chip network resources must be used to establish a data flow channel between the modules. The timing of the data flow must ensure that the same batch is being executed on the different modules. In the example illustrated in FIG. 12B, f1 can send two signals along with data simultaneously to f2 and f3, so as to trigger the execution of f2 and f3.

For modules that execute in data-driven parallel, different groups of hardware are assigned to different modules. As described above, the programs should have similar execution times for optimal load balancing. Cognitive data routing network resources and cognitive on-chip network resources will be used to establish data flow channels between the modules. The timing of the data flow must ensure that the proper batches of data are being executed. For the example illustrated in FIG. 12A and Table 1, in time period 3, hardware group 1 is executing data frame 3, hardware group 2 is executing frame 2, and hardware group 2 is executing data frame 1.

When establishing data flow channels, the protocol channels may or may not be used. A compiler can analyze the data flow between modules and determine whether the data flow is synchronous or asynchronous as follows:

For data flowing from a sender to a receiver, if the rate of production for the sender is equal to the rate of consumption for the receiver, or can be made so, the flow a synchronous data flow.

Otherwise, if the rate of production for the sender does not equal the rate of consumption for the receiver, the flow is an asynchronous data flow.

A synchronous data flow can be implemented without the assistance of a protocol channel so as to save resource usage. For example, for the application program illustrated in FIG. 12A, if the time for executing each module for one data frame plus the time for transmitting one frame of intermediate data to the next module equals 25,000 cycles, then every 25,000 cycles each module can begin executing a new frame of data, without needing to use the protocol channel to receive notification from the previous module.

An asynchronous data flow must be implemented with the assistance of the protocol channel if the time for executing each module for one data frame plus the time for transmitting one frame of intermediate data to next module is unknown, because the protocol channel must be used to send notifications from the sender module to the receiver module indicating that data is ready.

In embodiments, the compiler also analyzes each module and generates a dependency graph of intrinsic operations that are available in the hardware resources that the module is assigned to. The intrinsic operations can then be interconnected using the cognitive data routing network in an order that matches the order in the dependency graph, while independent operations can be executed in parallel based on the availability of suitable components. Using this method, the processing unit becomes much more efficient because it can perform multiple operations in parallel based on the software requirements at any particular moment.

In some embodiments, an automatic tool generates the machine code by using a search algorithm with heuristics to meet the application requirements while optimizing specific memory space usage or clock cycle usage for each specific module. For example, using X lines of program memory space and executing the code on module A using less than Y clock cycles.

FIGS. 13A and 13B illustrate the addition in embodiments of a Time Field into the instructions used for all programming units. In the prior art example of FIG. 13A, the Opcode could specify an ADD instruction, as well as the addressing mode of the operands, where the operands could be R1, R2, or 10,000 (if immediate addressing was specified). In the present invention, a time field is added to the instruction, specifying how many clock cycles the instruction will last. The Time Field specifies the number of clock cycles for which only one instruction fetch and decode will be performed. Accordingly, if the Time Field=10, for example, then the same instruction will be used for 10 clock cycles. If the instruction is fetched at clock cycle 0, then there will be no more instruction fetches or decodes during clock cycles 1-9. if the Time Field=100, an instruction fetch and decode will be performed only during the first clock cycle, after which the instruction will be executed during the 2nd to 100th clock cycles without any instruction fetch and decode operations, thereby saving 99% of the energy used for instruction fetch and decode operations.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application.

This specification is not intended to be exhaustive. Although the present application is shown in a limited number of forms, the scope of the invention is not limited to just these forms, but is amenable to various changes and modifications without departing from the spirit thereof. One or ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

We claim:

1. A method of configuring and programming a multi-core processor for execution of application software, the method comprising:
   providing a multi-core processor comprising:
      a plurality of processing units capable of executing intrinsic operations;
      a plurality of memory blocks;
      a plurality of cognitive data routing units that can be configured or programmed to route data from any of the processing unit to any of the memory blocks, from any of the processing units to any other of the processing units, from any of the memory blocks to any of the processing units, and from any of the memory blocks to any other of the memory blocks; and
      a cognitive on-chip network comprising a network of ports, each port comprising a data channel and a protocol channel, the network being able to connect ports together by connecting the output data channels to the input data channels and the bi-directional protocol channels to each other;
   the cognitive data routing units and the cognitive on-chip network being able to form communication channels between the processing units with or without assistance from the memory blocks;
   partitioning the application software into a plurality of separate modules that form a dependency graph having an edge that indicates data flow between the modules;
   determining which modules should be executed in series on common hardware, in program-driven parallel on different hardware, and in data-driven parallel on different hardware, according to the following rules:
      1) only modules having multiple sets of inputs can execute in data-driven parallel on different hardware;
      2) modules having no data flow between them can execute in parallel on different hardware without using cognitive data routing network resources or cognitive on-chip network resources;
      3) modules having data flow between them can execute in parallel on different hardware with usage of cognitive data routing network and cognitive on-chip network resources for routing data between the different hardware; and
      4) all modules can execute in series on same hardware estimating a computation requirement for each of the modules;
   estimating data flow requirements between the modules;
   assigning hardware computation resources to each of the module in two dimensions according to specific processing units used by each module and computational time requirements based on the determined computation requirement in addition to a specified time overhead;
   assigning data routing resources in two dimensions, according to specific cognitive data routing units and cognitive on-chip network units and the data flow time requirements based on the determined data flow requirements in addition to a specified time overhead; and
   using an automatic tool to generate machine code for execution by the processor.

2. The method of claim 1, wherein the method includes partitioning a module into submodules that execute in series, and assigning the same hardware group and different execution times to each of the submodules, whereby an execution time of the module is a sum of the execution times of the submodules.

3. The method of claim 1, wherein the method includes:
   partitioning the application software into modules having similar execution times that execute in program-driven parallel;
   assigning hardware groups of varying sizes to the modules;
   configuring the cognitive data routing units and cognitive on-chip network for data flow between the modules, said data flow having a required timing if data flow between the modules is included.

4. The method of claim 1, wherein the application software requires a plurality of sets of input data, and the method includes:
   partitioning the software into modules having similar execution times that execute in data-driven parallel;
   assigning hardware groups of varying size to the modules; and
   configuring the cognitive data routing units and cognitive on-chip network for data flow between the modules having a required timing.

5. The method of claim 1, wherein the method includes analyzing data flow between the modules and determining whether the data flow is synchronous or asynchronous, whereby for a data flow from sending module to a receiving module:
   if a rate of production for the sending module is equal to or can be made equal to a rate of consumption of the receiving module, the data flow is a synchronous data flow;
   if the rate of production is not equal to and cannot be made equal to the rate of consumption, the data flow is an asynchronous data flow;
   a synchronous data flow can be implemented without assistance from a protocol channel; and
   an asynchronous data flow requires assistance from a protocol channel.

6. The method of claim 1, wherein the method includes analyzing each module and generating a dependency graph of intrinsic operations that are available in the architecture, whereby the intrinsic operations can then be inter connected in an order that matches the dependency graph using the cognitive data routing network and independent operations can be executed in parallel based on availability of hardware resources.

7. The method of claim 1, wherein an automatic tool is used to generate the machine code using a search algorithm with heuristics to meet requirements of the application software while optimizing at least one of memory space usage and clock cycle usage for each module.

\* \* \* \* \*